United States Patent
Lee

(10) Patent No.: US 6,329,279 B1
(45) Date of Patent: Dec. 11, 2001

(54) METHOD OF FABRICATING METAL INTERCONNECT STRUCTURE HAVING OUTER AIR SPACER

(75) Inventor: Robin Lee, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/535,495

(22) Filed: Mar. 24, 2000

(30) Foreign Application Priority Data

Mar. 20, 2000 (TW) .................................. 89105038

(51) Int. Cl.[7] .................. H01L 21/4763; H01L 21/3205; H01L 21/311
(52) U.S. Cl. .......................... 438/619; 438/595; 438/421; 438/669; 438/672; 438/353
(58) Field of Search .................. 438/619, 421, 438/422, 622, 652, 666, 667, 669, 672, 595, 623, 624, 294, 353

(56) References Cited

U.S. PATENT DOCUMENTS

| | | | |
|---|---|---|---|
| 5,407,860 | * | 4/1995 | Stoltz et al. .......................... 437/180 |
| 5,915,182 | * | 6/1999 | Wu ....................................... 438/299 |
| 6,093,612 | * | 7/2000 | Suh ...................................... 438/301 |
| 6,228,763 | * | 5/2001 | Lee ...................................... 438/639 |

OTHER PUBLICATIONS

Ueda et al, "A Novel Air–Gap Integration Scheme for Multi–level Interconnects using Self–aligned Via Plugs", VLSI Technology, 1998, Diggest of Technical Paper Symposium Jun. 9, 1998 pp 46–47.*

Togo et al, "A Gate–side Air–gap Structure (GAS) to reduce the Parsitic Capacitance in MOSFET's", VLSI Technology 1996, Digest of Technical Paper Symposium Jun. 11, 1996 pp 38–39.*

Shieh et al, "Integration and Reliability Issues for Low Capacitance Air–gap Interconnect structures", Interconnect Technology Conference 1998, the IEEE International, Jun. 1, 1998 pp.125–127.*

* cited by examiner

Primary Examiner—Charles Bowers
Assistant Examiner—Thanhha Pham
(74) Attorney, Agent, or Firm—Jiawei Huang; J. C. Patents

(57) ABSTRACT

An outer air spacer structure, applicable to multilevel interconnects technologies, and the method of making the same are disclosed. The outer air spacer is adjacent to a metal line to provide a lower dielectric constant in a metal interconnect structure. The outer air spacer is formed by initially forming a first spacer adjacent to the metal line, followed by forming a second spacer on the first spacer. The first spacer is then removed to form an air gap between the second spacer and the metal line. The air gap is closed to form the outer air spacer by partially sealing the air gap with a portion of passivation layer that is deposited subsequently.

12 Claims, 3 Drawing Sheets

METHOD OF FABRICATING METAL INTERCONNECT STRUCTURE HAVING OUTER AIR SPACER

CROSS-REFERENCE TO RELATED APPLICATION

This application claims the priority benefit of Taiwan application serial no. 89105038, filed Mar. 20, 2000.

BACKGROUND OF THE INVENTION

1. Field of Invention

The present invention relates to a fabrication method for a semiconductor device. More particularly, the present invention relates to a method of fabricating a metal interconnect structure having an outer air spacer between metal interconnects, applicable to multilevel interconnect technologies.

2. Description of Related Art

In order to build an integrated circuit, it is necessary to fabricate many active devices on a single substrate. Initially, each of the devices must be electrically isolated from the others, and specific devices must subsequently be interconnected in the fabrication sequence so as to implement the desired circuit function, such as processing data in a microprocessor.

The data processing capability of the microprocessor has been extended to respond to more powerful and sophisticated program software, while such extension inevitably requires an increase in the operation speed of a metal oxide semiconductor (MOS) device. The operation speed of the MOS device is increased by creating an environment having a low dielectric constant between adjacent metal interconnects in a multi-level interconnect structure, while such environment is essential for reducing a cross-talk error and a capacitance between the metal interconnects. Since air was known to have a very low dielectric constant (about 1), an optimal dielectric constant for reduction of cross-talk and adverse capacitive coupling in polysilicon and metal interconnect, an air gap structure formed between the metal interconnects has been adopted in most interconnect process. As a result, the circuit speed is improved and logical cross-talk errors are avoided. FIGS. 1A and 1B are schematic, cross-sectional diagrams illustrating a conventional method of fabricating the air gap structure.

Referring to FIG. 1A, a dielectric layer 100 is provided above a device layer (not shown), wherein the dielectric layer 100 has metal plugs 102 formed therein. Metal lines 104 are formed on the dielectric layer 100 to cover the metal plugs 102. As a result, the metal lines 104 are not in direct contact with the metal layer (not shown) below the dielectric layer 100, except through the metal plugs 102 in order to prevent an electrical short.

Referring to FIG. 1B, an inter-metal dielectric (IMD) layer 106 is formed to cover the metal lines 104 and the dielectric layer 100 by a method, such as plasma enhanced chemical vapor deposition (PECVD). The IMD layer is usually made of material, such as silicon dioxide, due to its low dielectric constant (about 3.9). According to the method taught by such prior art, one skilled in the art would expect to form a void or air gap 108 between two adjacent metal lines 104, as shown in FIG. 1B. However, the air gap 108 formed as such, does not effectively reduce the dielectric constant between the metal lines 104. Moreover, the air gap 108 can only be formed between metal lines 104 that are in a denser distribution. Therefore, other materials, such as hydrogen silsesquioxane (HSQ) which provides a lower dielectric constant (about 2.9–3.0) and offers a better topographical planarity is needed to reduce the dielectric constant between the metal lines 104 in a metal interconnect structure.

However, when HSQ is applied to interconnect technology, particularly for gap filling, it was found that its dielectric constant may become undesirably high as a result of subsequent processing. For example, after the deposition of the silicon oxide layer by PECVD, the dielectric constant of the deposited HSQ layer undesirably increased from about 2.9 to about 3.6. This rise in dielectric constant is believed to be a result of the oxidation of the top surface of the HSQ due to exposure to an oxygen-containing ambient at an elevated temperature. The undesirable increase in the dielectric constant of the HSQ layer adversely impacts the intra-metal capacitance and, therefore circuit speed.

SUMMARY OF THE INVENTION

The invention provides a fabrication method for a metal interconnect structure having outer air spacers between metal interconnects, applicable to multi level interconnect technologies.

As embodied and broadly described herein, the invention provides outer air spacers between adjacent metal interconnects, which outer air spacers are formed using a double spacer technology. The outer air spacers are formed adjacent to the metal line and are delineated by a second spacer, a metal line, and a second dielectric layer on the first dielectric layer.

According to the present invention, a fabrication method for a metal interconnect structure having outer air spacers between metal interconnects is provided. A first dielectric layer is formed on a MOS device layer, wherein the first dielectric layer has a metal plug formed therein. A patterned metal layer is formed on the first dielectric layer to cover the metal plug, and a first spacer is formed on a sidewall of the patterned metal layer. A second spacer is then formed on the first spacer prior to removal of the first spacer, so that an air gap is formed between the second spacer and the sidewall of the patterned metal layer. A second dielectric layer is formed on the first dielectric layer, the patterned metal layer, and the second spacer, while top of the air gap is partially sealed off by a portion of the second dielectric layer to form an outer air spacer.

Since the outer air spacer is formed closely adjacent to the metal line, the dielectric constant between the metal interconnects is significantly reduced, so that the gap between the metal interconnects can be filled with dielectric materials other than silicon dioxide. The outer air spacer formed as described above is also compatible with other dielectric materials to achieve the objective of reducing the dielectric constant. Furthermore, the outer air spacer can be formed on the sidewalls of the metal lines that are located wider apart. Thus, this ensures a uniform reduction of the dielectric constant between the metal interconnects and improves the circuit speed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Description of the present invention is made with reference to FIGS. 2A through 2E, which illustrate the method of fabricating an outer air spacer.

Figure 1A:
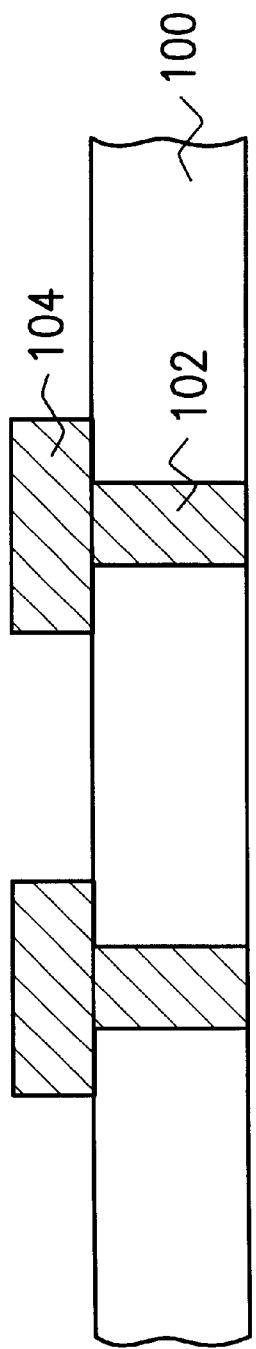
FIGS. 1A and 1B are schematic, cross-sectional diagrams illustrating a conventional method of fabricating a metal interconnect having an air gap structure.
Figure 1B:
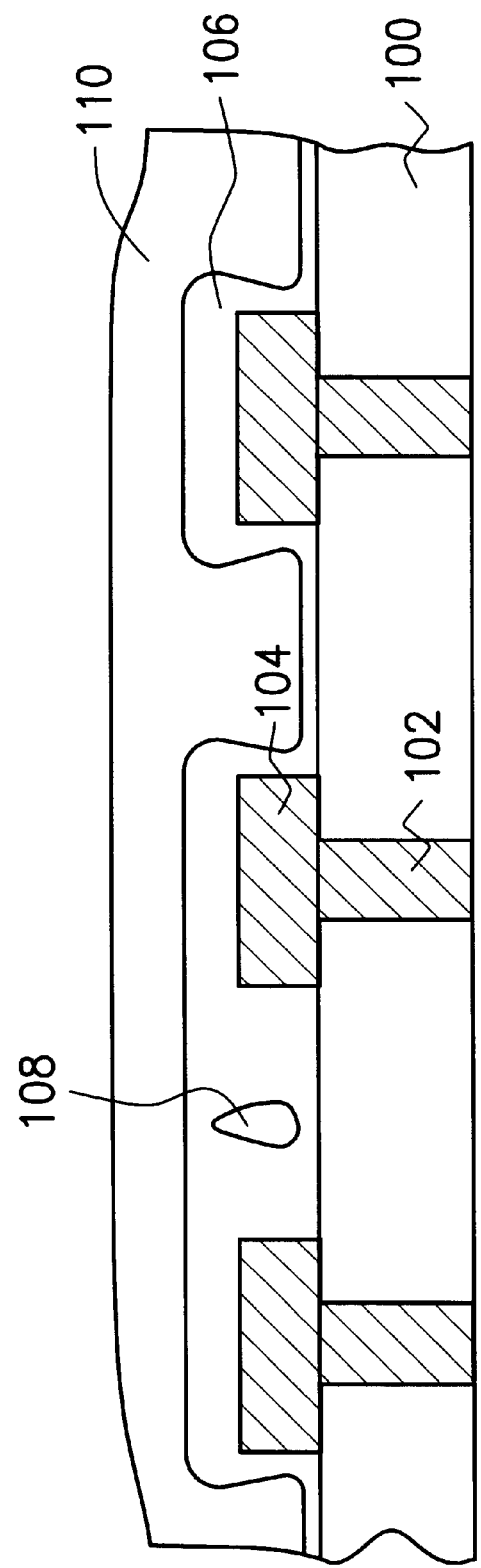
Figure 2A:
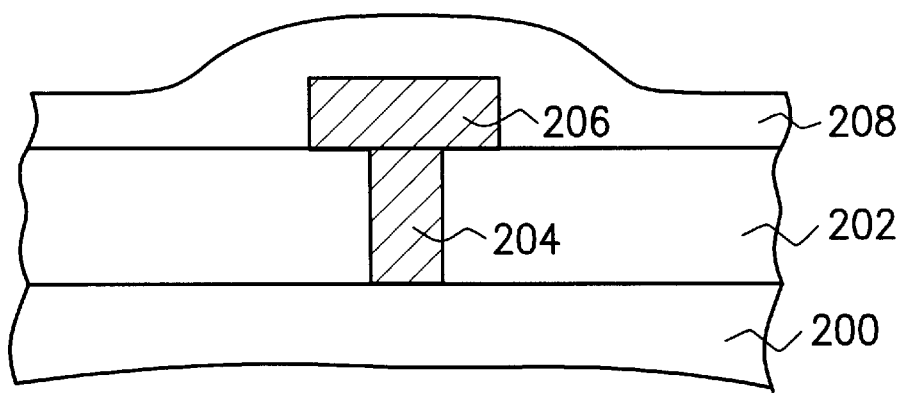
FIGS. 2A through 2E are schematic, cross-sectional diagrams illustrating a method of fabricating a metal interconnect having an outer air spacer according to one preferred embodiment of this invention.

Referring to FIG. 2A, a first dielectric layer 202 is formed on a MOS device layer 200, wherein the first dielectric layer 202 has a metal plug 204 formed therein. The first dielectric layer 202 is made of material, such as silicon dioxide, while the metal plug 204 may include any conductive material, but it preferably includes a tungsten plug. A metal layer is formed and patterned on the first dielectric layer 202, so that a patterned metal layer 206 covers the metal plug 204 and a part of the first dielectric layer 202, as shown in FIG. 2A. A first insulating layer 208 is then formed by deposition on the first dielectric layer 202 and the patterned metal layer 206, wherein the first insulating layer 208 is made of materials, such as photoresist or polymer. The deposition method in this case includes chemical vapor deposition (CVD).

Figure 2B:
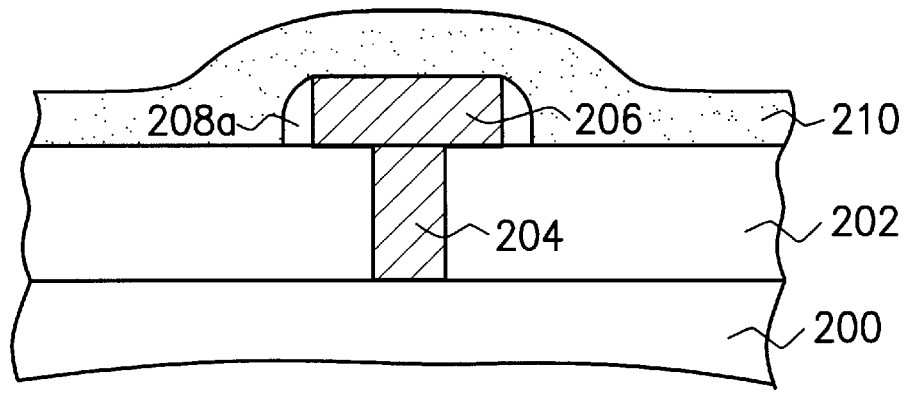

Referring to FIG. 2B, an etching back process is performed to remove the first insulating layer 208 on the patterned metal layer 206 and a part of the first insulating layer 208 on the first dielectric layer 202. This leaves a part of the first insulating layer 208 to remain on a sidewall of the patterned metal layer 206, while the remaining part of the first insulating layer 208 forms a first spacer 208a. A second insulating layer 210 is formed to cover the first dielectric layer 202, the patterned metal layer 206, and the first spacer 208a. The second insulating layer 210 can be made of materials that show different etching selectivity from that of the first insulating layer 208, but the second insulating layer 210 preferably includes silicon oxide and silicon nitride.

Figure 2C:
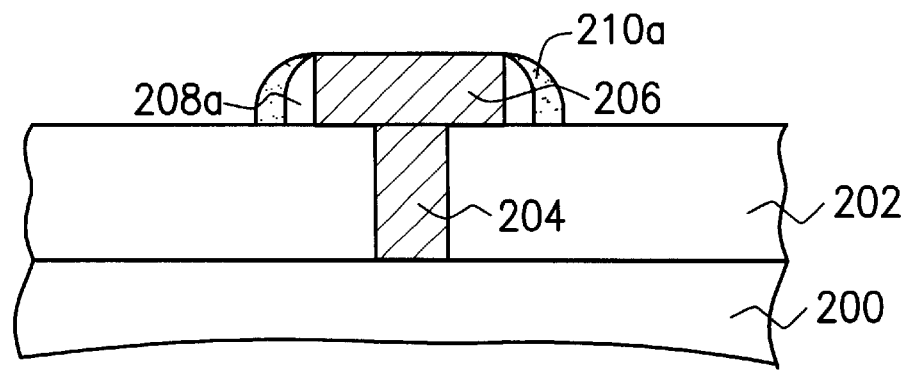

Referring to FIG. 2C, another etching back process is perform using a etching solution that shows a higher etching rate for the second insulating layer 210, so that only a part of the second insulating layer 210 remains to form a second spacer 210a. It to is noted that a width of the second spacer 210a can be controlled through different thickness of the second insulating layer 210 or through etching. The second spacer 210a is formed on the first spacer 208a, so that a double spacer structure is adjacent to the sidewall of the patterned metal layer 206.

Figure 2D:
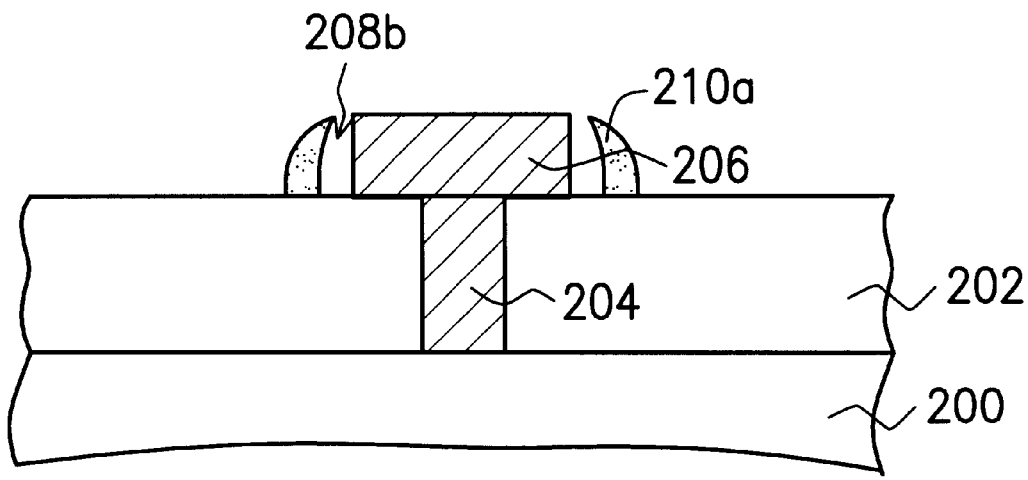

Referring to FIG. 2D, the first spacer 208a is completely removed, leaving a air gap 208b formed between the patterned metal layer 206 and the second spacer 210a. The first spacer 208a is removed by either performing a wet etching or a dry etching. When the wet etching process is performed, an etching solution having a higher etching rate for the first spacer 208a is used. Alternatively, the dry etching process is performed using an etching plasma which removes the first spacer 208a. However, a wet etching process is preferred in this embodiment. The air gap 208b that is formed between the patterned metal layer 206 the second spacer 210a reduces the dielectric constant in a metal interconnect structure.

Figure 2E:
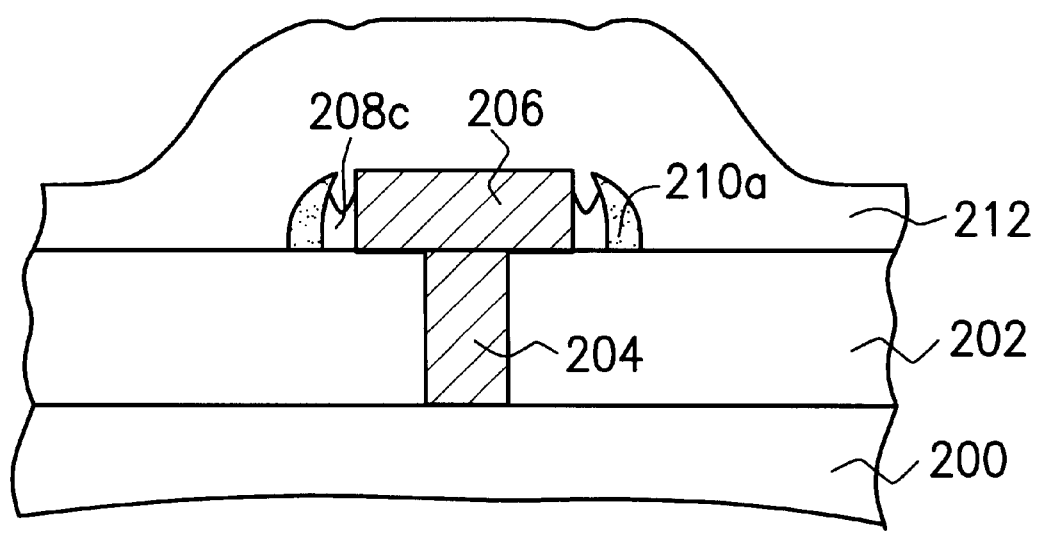

Referring to FIG. 2E, a second dielectric layer 212 is formed on the interconnect structure, so that a portion of the second dielectric layer 212 fills in the air gap 208b. The portion of the second dielectric layer 212 seals off the air gap 208b to form an outer air spacer 208c, wherein the outer spacer 208c is delineated by the patterned metal layer 206, the second spacer 210a, and the portion of the second dielectric layer 212. The second dielectric layer 212 may be made of materials for forming a passivation layer of the interconnect structure, but it preferably includes silicon nitride.

Summarizing from the above, it is understood that the outer air spacer is formed closely adjacent to the metal line, so that the dielectric constant between the metal layers is significantly reduced. Also, a gap between the metal layers can be filled with dielectric materials other than silicon dioxide. The outer air spacer formed as described above is also compatible with other dielectric materials in order to reduce the dielectric constant. Furthermore, outer air spacers can be formed on the sidewalls of the metal layers that are located wider apart. Thus, this ensures a uniform reduction of the dielectric constant between the metal layers in the metal interconnect structure and improves the circuit speed as a consequence.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a metal interconnect structure having an outer air spacer, comprising steps of:

forming a first dielectric layer on a MOS device layer, wherein the first dielectric layer has a metal plug formed therein;

forming a patterned metal layer on the first dielectric layer, wherein the patterned metal layer covers the metal plug and a part of the first dielectric layer;

forming an insulating spacer adjacent to a sidewall of the patterned metal layer and on the first dielectric layer;

forming a dielectric spacer on the insulating spacer;

removing the insulating spacer, so that an air gap is formed between the patterned metal layer and the dielectric spacer; and forming a second dielectric layer on the first dielectric layer, so that a portion of the second dielectric layer seals off the air gap to form the outer air spacer.

2. The fabrication method of claim 1, wherein the method for forming the insulating spacer includes:

forming a first insulating layer on a sidewall of the patterned metal layer; and performing an etching back process to remove a part of the first insulating layer.

3. The fabrication method of claim 2, wherein the step of forming the first insulating layer includes plasma enhanced chemical vapor deposition (PECVD).

4. The fabrication method of claim 2, wherein the first insulating layer includes a polymer layer.

5. The fabrication method of claim 2, wherein the first insulating layer includes a photoresist layer.

6. The fabrication method of claim 1, wherein the step of removing the insulating spacer includes a wet etching process.

7. The fabrication method of claim 1, wherein the dielectric spacer includes an oxide spacer.

8. A fabrication method for an interconnect structure having an air spacer, comprising steps of:

forming a patterned metal layer on a silicon oxide layer;

forming a first spacer on a sidewall of the patterned metal layer;

forming a second spacer on the first spacer;

performing a wet etching process, so that the first spacer is removed to form an air gap between the patterned metal layer and the second spacer; and forming a silicon nitride layer on the silicon oxide layer, whereby the silicon nitride layer covers the patterned metal layer, the air gap, and the second spacer to form the air spacer.

9. The fabrication method of claim 8, further comprising forming a tungsten plug in the silicon oxide layer before the step of forming a patterned metal layer on a silicon oxide layer.

10. The fabrication method of claim 8, wherein the first spacer include a polymer spacer.

11. The fabrication method of claim 8, wherein the first spacer include a photoresist spacer.

12. The fabrication method of claim 8, wherein the second spacer include an oxide spacer.

* * * * *